(12) United States Patent
Ogawa

(10) Patent No.: US 8,039,758 B2
(45) Date of Patent: Oct. 18, 2011

(54) MOUNTING STRUCTURE FOR ELECTRONIC COMPONENT

(75) Inventor: Kazuto Ogawa, Yoshida-gun (JP)

(73) Assignee: Murata Manufacturing Co., Ltd., Kyoto (JP)

(*) Notice: Subject to any disclaimer, the term of this patent is extended or adjusted under 35 U.S.C. 154(b) by 886 days.

(21) Appl. No.: 11/752,824

(22) Filed: May 23, 2007

(65) Prior Publication Data

US 2007/0223206 A1 Sep. 27, 2007

Related U.S. Application Data

(63) Continuation of application No. PCT/JP2006/305944, filed on Mar. 24, 2006.

(30) Foreign Application Priority Data

Mar. 29, 2005 (JP) .................................. 2005-093577
Feb. 24, 2006 (JP) .................................. 2006-048791

(51) Int. Cl.
*H05K 1/16* (2006.01)

(52) U.S. Cl. ........................................ 174/260; 361/767

(58) Field of Classification Search .................. 174/260; 361/767–771
See application file for complete search history.

(56) References Cited

U.S. PATENT DOCUMENTS

| 4,870,225 | A | 9/1989 | Anao et al. |
| 6,566,611 | B2 | 5/2003 | Kockanowski et al. |
| 7,280,370 | B2 * | 10/2007 | Chan .............................. 361/767 |
| 2003/0173577 | A1 | 9/2003 | Yoon et al. |
| 2003/0184986 | A1 * | 10/2003 | Soga et al. .................... 361/767 |

FOREIGN PATENT DOCUMENTS

| DE | 38 00 116 A1 | 7/1988 |
| DE | 103 01 512 A1 | 10/2003 |
| JP | 62-136096 A | 6/1987 |
| JP | 01-245591 A | 9/1989 |
| JP | 02-065293 A | 3/1990 |
| JP | 04-217388 A | 8/1992 |
| JP | 4-121779 U | 10/1992 |
| JP | 2000-299548 A | 10/2000 |

OTHER PUBLICATIONS

Official communication issued in counterpart German Application No. 11 2006 000 153.1, mailed on Jan. 15, 2009.
Official Communication for PCT Application No. PCT/JP2006/305944; mailed on Jun. 20, 2006.

* cited by examiner

*Primary Examiner* — Jeremy Norris
(74) *Attorney, Agent, or Firm* — Keating & Bennett, LLP

(57) ABSTRACT

A mounting structure is provided in which outer electrodes of an electronic component are soldered on lands provided on a circuit board. Two of the lands on which two of the outer electrodes disposed along a diagonal of a principal surface of the electronic component are soldered, are configured such that inner vertexes defined at opposite ends of a minimum distance between the lands are aligned with inner vertexes defined at opposite ends of a minimum distance between the outer electrodes. That is, sides of the outer electrodes are aligned with outer edges of the lands. Accordingly, only one positional relationship is permitted between the electronic component and the mounting surface, the positional relationship causing a total area of the outer electrodes facing the lands to be maximized.

6 Claims, 7 Drawing Sheets

MOUNTING STRUCTURE FOR ELECTRONIC COMPONENT

BACKGROUND OF THE INVENTION

1. Field of the Invention

The present invention relates to a mounting structure for mounting an electronic component on a circuit board, and more particularly, the present invention relates to a mounting structure for mounting an electronic component on a circuit board with a high positional accuracy.

2. Description of the Related Art

As shown in FIG. 12, an example of a mounting structure of a related art for an electronic component is that surface-mounting lands 11, 12, 13, and 14, on which outer electrodes 21, 22, 23, and 24 of an electronic component 20 are soldered, are provided on a mounting surface of a circuit board 10, such as a ceramic multilayer board, or a printed circuit board. The lands 11, 12, 13, and 14 are provided at positions corresponding to positions of the outer electrodes 21, 22, 23, and 24 of the electronic component 20. To reliably mount the electronic component 20, each of the lands 11, 12, 13, and 14 have a size greater than that of each of the outer electrodes 21, 22, 23, and 24 of the electronic component 20.

The electronic component 20 is mounted on the circuit board 10 as follows. The electronic component 20 is arranged such that the outer electrodes 21, 22, 23, and 24 are aligned with solder pastes printed on the lands 11, 12, 13, and 14, the circuit board 10 with the electronic component 20 mounted thereon passes through a reflow oven (not shown) to melt the solder pastes, and thus, the outer electrodes 21, 22, 23, and 24 are soldered on the lands 11, 12, 13, and 14.

The mounting structure of the related art has the following problems. The melted solder easily adheres to the lands 11, 12, 13, and 14 and the outer electrodes 21, 22, 23, and 24, thus exhibiting good wettability, whereas the melted solders exhibit poor wettability with respect to a board material for the circuit board 10, and a constituent body 20a of the electronic component 20. Due to this, the solder melted as the circuit board 10 with the electronic component 20 mounted thereon passes through the reflow oven does not flow outside the lands 11, 12, 13, and 14, or outside the outer electrodes 21, 22, 23, and 24.

As shown in FIG. 13A, when the land 11 of the lands 11, 12, 13, and 14, and the outer electrode 21 soldered on the land 11 are considered, the melted solder provided therebetween easily wets the land 11 and the outer electrode 21 and adheres to the electrodes and lands due to the wettability of the melted solder.

At this time, the solder simultaneously spreads on the outer electrode 21 and the land 11 in a wet manner, and thus, a self-alignment action is applied to the electronic component so that a maximum superposed area of the outer electrode 21 and the land 11 is achieved. However, when the mounting structure is designed such that the superposed area of the outer electrode 21 and the land 11 does not vary even when the position of the outer electrode 21 is shifted to the upper, lower, left or right side as shown in FIG. 13B, the electronic component 20 may be influenced by a vibration or impact applied from the outside, or by variation in the position at the mounting, causing the electronic component 20 to move freely within a range in which the superposed area remains unvaried. Accordingly, if the solder solidifies after the electronic component 20 is moved, the mounting position of the electronic component 20 may vary.

In order to solve the above-described problems with the mounting structure of the related art, as shown in FIG. 14, Japanese Unexamined Patent Application Publication No. 2000-299548 (Patent Document 1) discloses a land structure for mounting a surface-mounted component 3 on a printed circuit board 1, the surface-mounted component 3 including terminals 3b, 3b each having a narrow width A and protruding from the opposite lateral surfaces of a body 3a.

Provided on a surface (mounting surface) of the printed circuit board 1 are protruding lands 2, 2 having protruding portions 2a, 2a on which the terminals 3b, 3b of the surface-mounted component 3 are soldered. The protruding portions 2a, 2a of the lands 2, 2 each have a narrow width B corresponding to the width A of the terminals 3b, 3b of the surface-mounted component 3, and protrude inwardly so as to face each other. Solder paste is printed on the protruding portions 2a, 2a of the lands 2, 2, the terminals 3b, 3b are provided on the solder paste, the solder paste is melted through the reflow oven, and the terminals 3b, 3b are soldered on the protruding portions 2a, 2a.

With the land structure described in Patent Document 1, since the width B of the protruding portions 2a, 2a of the lands 2, 2 is narrow and corresponds to the width A of the terminals 3b, 3b of the surface-mounted component 3, the protruding portions 2a, 2a each have a width substantially equivalent to that of the terminals 3b, 3b. Thus, the surface-mounted component 3 can be mounted on the printed circuit board 1 with a high positional accuracy due to the action of the self-alignment caused by the surface tension of the solder paste melted in the reflow oven.

However, since the protruding portions 2a, 2a have the narrow width B substantially equivalent to the width A of the terminals 3b, 3b, it is difficult to reliably apply the solder paste to the protruding portions 2a, 2a by printing, thereby causing problems of insufficient printing of the solder paste, a decrease in mounting strength of the surface-mounted component 3, and a poor mounting reliability of the surface-mounted component 3 to the printed circuit board 1.

SUMMARY OF THE INVENTION

To overcome the problems described above, preferred embodiments of the present invention provide a mounting structure capable of reliably mounting an electronic component on a circuit board with high positional accuracy and a high mounting strength.

A first preferred embodiment of the present invention provides a mounting structure for an electronic component in which a plurality of outer electrodes provided on a principal surface of the electronic component are electrically connected to a plurality of corresponding lands provided on a mounting surface of a circuit board by soldering. In the structure, each of the lands has an area greater than an area of each of the outer electrodes, one side of the lands defining the contour of one of the outer electrodes is aligned with an outer edge of a corresponding one of the lands, and only one positional relationship is permitted between the electronic component and the mounting surface, the positional relationship causing a maximum total area of the outer electrodes facing the lands.

A second preferred embodiment of the present invention provides a mounting structure for an electronic component in which a plurality of outer electrodes provided on a principal surface of the electronic component are electrically connected to a plurality of corresponding lands provided on a mounting surface of a circuit board by soldering. In the structure, each of the lands have an area greater than an area of each of the outer electrodes which are substantially rectangular, the outer electrodes each have first to fourth sides at upper, lower, left and right portions thereof in plan view, and the outer electrodes include at least one outer electrode of which the first side is aligned with an outer edge of a corresponding one of the lands, at least one outer electrode of which the second side is aligned with an outer edge of a corresponding one of the lands, at least one outer electrode of which the third side is aligned with an outer edge of a corresponding one of the lands, and at least one outer electrode of which the fourth side is aligned with an outer edge of a corresponding one of the lands.

A third preferred embodiment of the present invention provides a mounting structure for an electronic component in which a plurality of outer electrodes provided on a principal surface of the electronic component are electrically connected to a plurality of corresponding lands provided on a mounting surface of a circuit board by soldering. In the structure, inner vertexes defined at opposite ends of a minimum distance between the outer electrodes located along a diagonal are aligned with inner vertexes defined at opposite ends of a minimum distance between the corresponding lands on which the outer electrodes are soldered.

A fourth preferred embodiment of the present invention provides a mounting structure for an electronic component in which a plurality of outer electrodes provided on a principal surface of the electronic component are electrically connected to a plurality of corresponding lands provided on a mounting surface of a circuit board by soldering. In the structure, outer vertexes defined at opposite ends of a maximum distance between the outer electrodes located along a diagonal are aligned with outer vertexes defined at opposite ends of a maximum distance between the corresponding lands on which the outer electrodes are soldered.

With the first, second, third and fourth preferred embodiments of the present invention, when solder paste is melted in a reflow oven, the solders spread on the outer electrodes and the lands on which the outer electrodes are soldered because the solder exhibits good wettability with respect to the electrodes and lands. So, the action of the self-alignment makes an area of the outer electrodes superposed on the lands maximum and the outer electrodes are superposed on the lands by only one positional relationship. Thus, the electronic component is mounted on the circuit board with outstanding positional accuracy.

That is, in the first preferred embodiment, the action of the self-alignment causes the electronic component to be positioned at one position that the total area of the plurality of outer electrodes facing the plurality of lands is at a maximum. In the second preferred invention, the action of the self-alignment causes the electronic component to be positioned at one position that the sides of the outer electrodes are aligned with the outer edges of the lands, respectively.

In the third and fourth preferred embodiments, the action of the self-alignment causes the electronic component to be positioned at one position that the area of the outer electrodes superposed on the lands is at a maximum. The position is achieved only when the inner or outer vertexes of the outer electrodes defined at the opposite ends of the minimum or maximum distance between the two outer electrodes located along the diagonal of the electronic component are aligned with the inner or outer vertexes of the lands defined at the opposite ends of the minimum or maximum distance between the corresponding lands.

In the third preferred embodiment, since the inner vertexes of the lands are aligned with the inner vertexes of the outer electrodes, respectively, any of the lands provided on the circuit board may be arranged such that a portion of the land protrudes outside the electronic component. Thus, the condition of the formed solder fillets adhering on the lands may be checked from the outside, for example, by inspecting the circuit board on which the electronic component has been mounted. This increases the reliability of an inspection for the mounting state of the electronic component relative to the circuit board.

In the third and fourth preferred embodiments, the inner or outer vertexes of the outer electrodes located along one of two diagonals may be aligned with the inner or outer vertexes of the corresponding lands. With this configuration, the lands of which inner or outer vertexes are not necessary to be aligned with the inner or outer vertexes of the outer electrodes, may have increased sizes so as to protrude outside the electronic component. Thus, the mounting strength of the electronic component can be further increased.

With the present invention, the action of the self-alignment due to the surface tension of the melted solder is effectively applied. So, the action of the self-alignment maximizes an area of a superposed area of the outer electrode and a land, and the outer electrode is superposed on the land in only one positional relationship. Thus, the electronic component is mounted on the circuit board with outstanding positional accuracy. A variation in an area, covered by solder, of the land is decreased, which increases mounting reliability.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 13A and 13B are views showing a positional shift of the electronic component in the mounting structure shown in FIG. 12, in which FIG. 13A shows a state in which the center of an outer electrode is aligned with the center of a land, and FIG. 13B shows a state in which the outer electrode is shifted relative to the land.

DETAILED DESCRIPTION OF PREFERRED EMBODIMENTS

Figure 1:
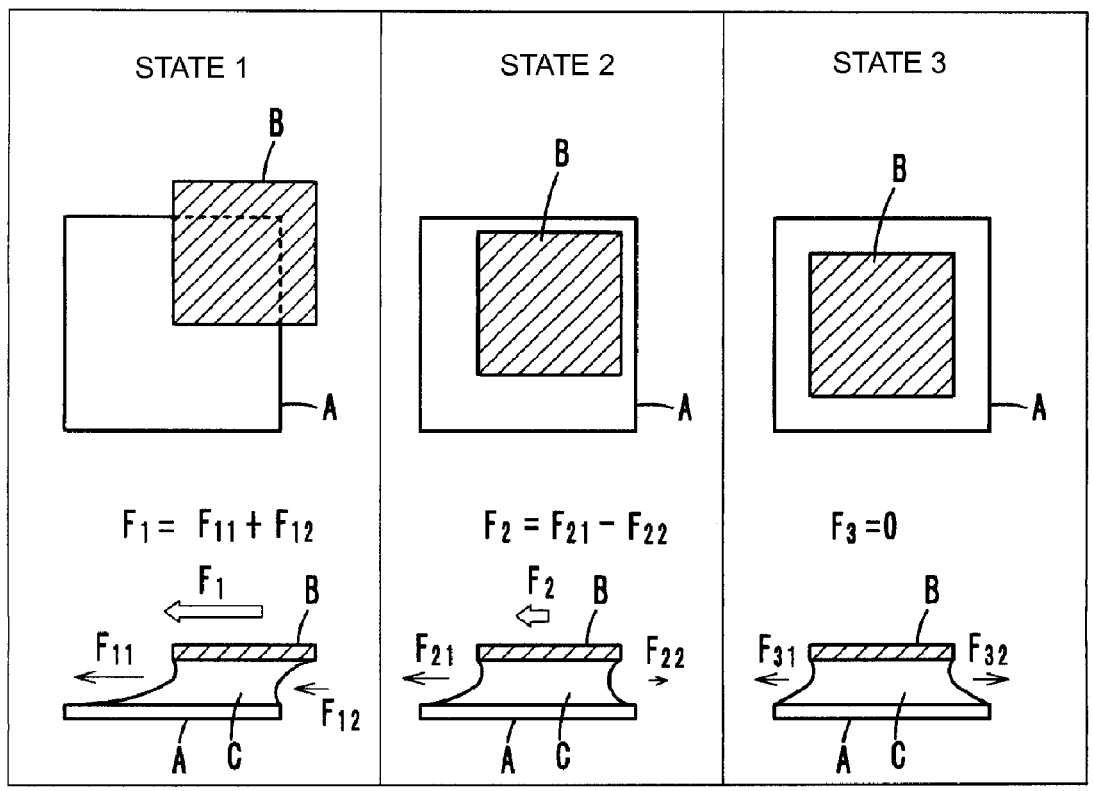
FIG. 1 is a view showing an action of self-alignment, which is the basic principle of the present invention.

Preferred embodiments of a mounting structure for an electronic component according to the present invention are described below with reference to the attached drawings. Note that the same reference numerals are assigned to the same or components and portions in the preferred embodiments, and redundant descriptions thereof are omitted.

Action of Self-Alignment

First, an action of self-alignment is described. The action of the self-alignment is utilized for accurately positioning an electronic component on lands of a circuit board. As shown in a state 1 of FIG. 1, when an outer electrode B protrudes from a land A, the surface tension of a solder C causes a force that minimizes the surface area of the solder C. So, moving forces $F_{11}$ and $F_{12}$ are generated, and the resultant force $F_1$ ($F_{11}+F_{12}$) acts on the outer electrode B. The resultant force $F_1$ is large, which causes the outer electrode B to be superposed on the land A with a large force.

In a state 2, the outer electrode B does not protrude from the land A, and an area of the outer electrode B facing the land A is maximized. A surface of the solder C on the right side thereof is substantially spherical, causing an extremely small moving force $F_{22}$. A surface of the solder C on the left side thereof is not spherical, causing a moving force $F_{21}$. So, the resultant force $F_2$ ($F_{21}-F_{22}$) acts on the outer electrode B. The resultant force $F_2$ is relatively small to move the outer electrode B to the center of the land A.

In a state 3, the center of the outer electrode B is aligned with that of the land A. In this case, moving forces $F_{31}$ and $F_{32}$ caused by the surface tension of the solder C are balanced. The resultant force $F_3$ is substantially zero, which means that a surface-mounted component is easily moved (shifted) if an impact, etc. is applied thereto from the outside.

As mentioned above, if the area of the outer electrode B facing the land A is not maximum, then the moving forces $F_{11}$ and $F_{12}$ act in the same direction at the left and right edges of the solder as shown in the state 1 of FIG. 1, causing the large force $F_1$ that makes the outer electrode B be superposed on the land A. In contrast, if the area of the outer electrode B facing the land A is maximum, then the surface tensions generated at opposite sides of the solder cancel each other out as shown in the states 2 and 3 of FIG. 1, causing the moving forces $F_2$ and $F_3$, which move the outer electrode B to the center of the land A, to be extremely small or zero.

The present invention utilizes the resultant force $F_1$ that acts as in the state 1. The state 1 is an unstable state for a single outer electrode, however, it is useful for a plurality of electrodes or electrodes disposed on a diagonal because the resultant forces of the electrodes can be balanced, and thus, positional accuracy of a surface-mounted component can be increased.

First Preferred Embodiment

Figure 2:
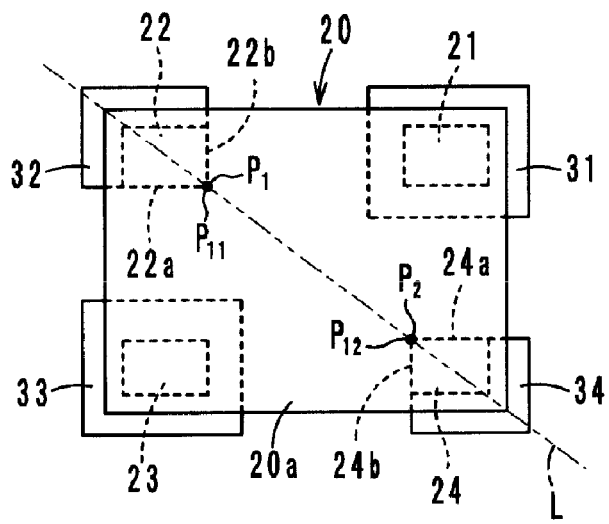
FIG. 2 is a view showing a mounting structure according to a first preferred embodiment of the present invention.
Figure 12:
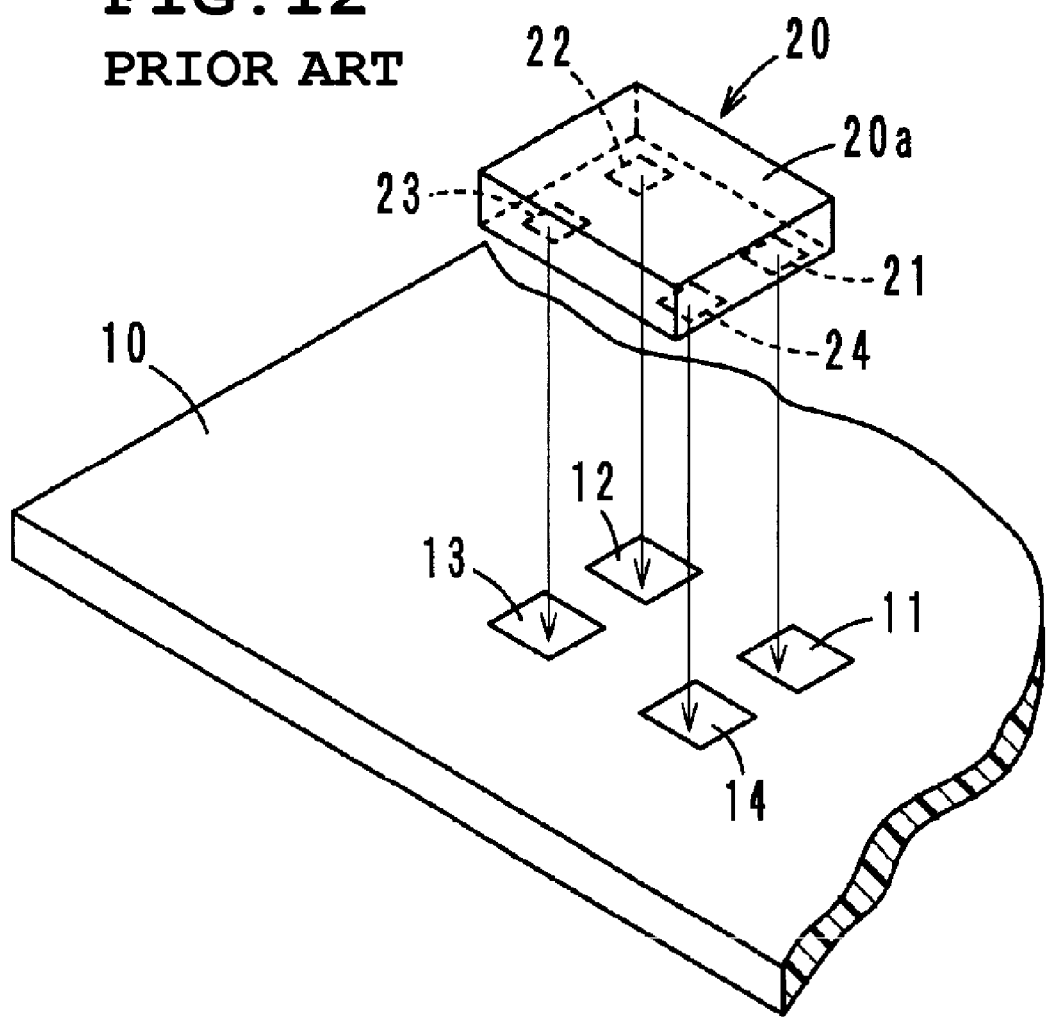
FIG. 12 is a perspective view showing a typical mounting structure for an electronic component.
Figure 13A:
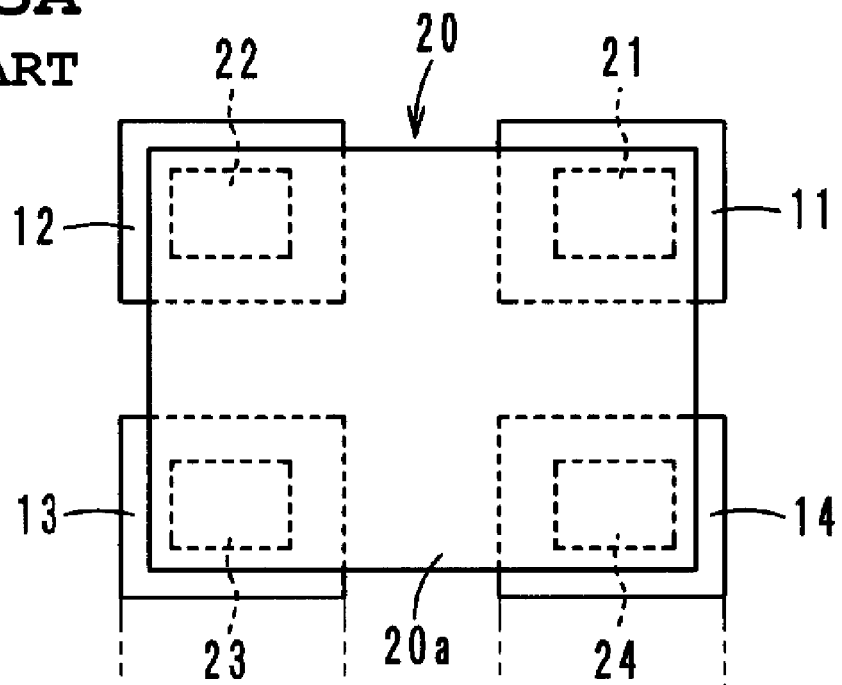
Figure 13B:
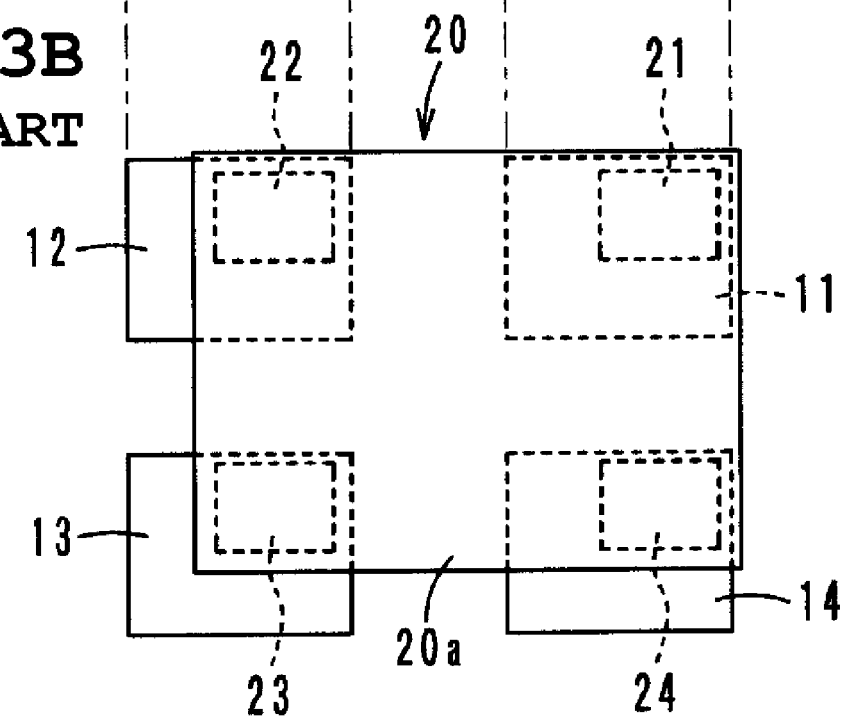
Figure 14:
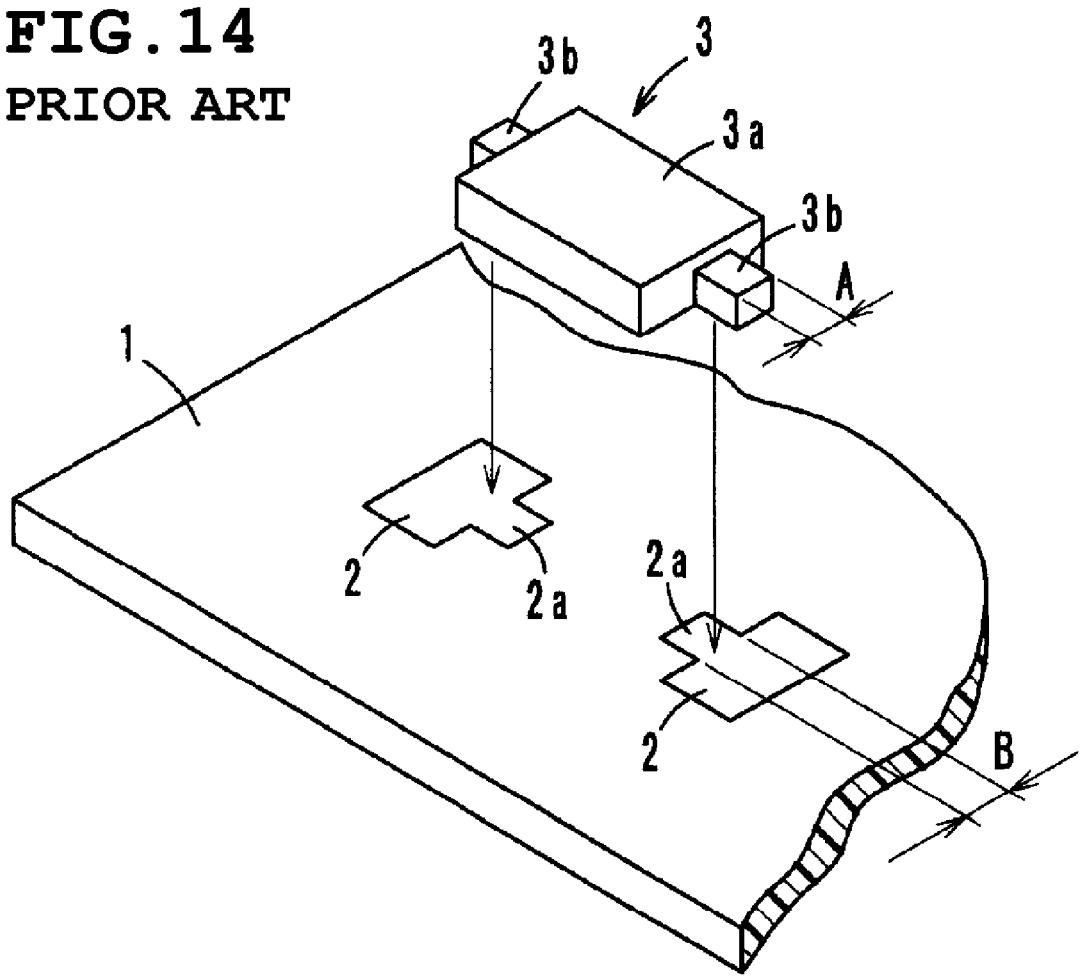
FIG. 14 is a perspective view showing a mounting structure of a related art for an electronic component.

As shown in FIG. 2, the outer electrodes 21 to 24 of the electronic component 20 according to a first preferred embodiment are soldered on lands 31 to 34 provided on the circuit board 10 (see FIG. 12), respectively. The lands 31 to 34 each have a size greater than that of each of the outer electrodes 21 to 24 of the electronic component 20.

The two lands 32 and 34 of the lands 31 to 34 each have a small size than that of each of the residual lands 31 and 33. The two outer electrodes 22 and 24 located along a diagonal L of a rectangular principal surface of the electronic component 20 provided with the outer electrodes 21 to 24 are soldered on the lands 32 and 34.

The two lands 32 and 34 are arranged such that inner vertexes $P_{11}$ and $P_{12}$ defined at opposite ends of a minimum distance between the two lands 32 and 34 are aligned with inner vertexes $P_1$ and $P_2$ defined at opposite ends of a minimum distance between the two outer electrodes 22 and 24.

With this configuration, when the circuit board with the electronic component 20 mounted thereon passes through a reflow oven (not shown), the lands 31 to 34 and the outer electrodes 21 to 24 opposed thereto are wetted with melted solder paste, and the melted solder paste adheres to the electrodes and lands due to wettability of the melted solder paste. The solder spreads on the outer electrodes 21 to 24 and the lands 31 to 34 in a wet manner, and thus, the action of the self-alignment is applied so that the area of the outer electrodes 21 to 24 superposed on the lands 31 to 34 is maximized.

In the first preferred embodiment, the two lands 32 and 34 are designed such that the oppositely-provided inner vertexes $P_{11}$ and $P_{12}$ of the lands 32 and 34 are aligned with the oppositely-provided inner vertexes $P_1$ and $P_2$ of the outer electrodes 22 and 24. Therefore, only one position for the surface-mounted component is provided so that the inner vertexes $P_{11}$ and $P_{12}$ are aligned with the inner vertexes $P_1$ and $P_2$, the position causing an area of the outer electrodes 21 to 24 superposed on the lands 31 to 34 to be maximized.

Thus, as the solder paste is melted in the reflow oven, the action of the self-alignment causes the area of the outer electrodes superposed on the lands to be maximized. So, the electronic component 20 is positioned such that the inner vertexes $P_{11}$ and $P_{12}$ are aligned with the inner vertexes $P_1$ and $P_2$.

The electronic component 20 is positioned such that the predetermined two points of the electronic component 20 (the two inner vertexes $P_1$ and $P_2$ of the outer electrodes 22 and 24) are always aligned with the predetermined two points of the circuit board (the two inner vertexes $P_{11}$ and $P_{12}$ of the lands 32 and 34). Thus, the electronic component 20 can be mounted with a high positional accuracy. Also, in the first preferred embodiment, as shown in FIG. 2, since a portion of each of the lands 31 to 34 provided on the circuit board protrudes from the periphery of the electronic component 20, the condition of solder fillets adhering on the lands 31 to 34 may be checked from the outside, for instance, by inspecting the mounting state of the electronic component 20.

That is, in the mounting structure according to the first preferred embodiment, sides 22a, 22b, 24a, and 24b, defining the contour of the outer electrodes 22 and 24, are aligned with outer edges of the lands 32 and 34. Therefore, only one positional relationship is provided between the electronic component 20 and the mounting surface, the positional relationship causing a total area of the outer electrodes 21 to 24 facing the lands 31 to 34 to be maximized.

Second Preferred Embodiment

Figure 3:
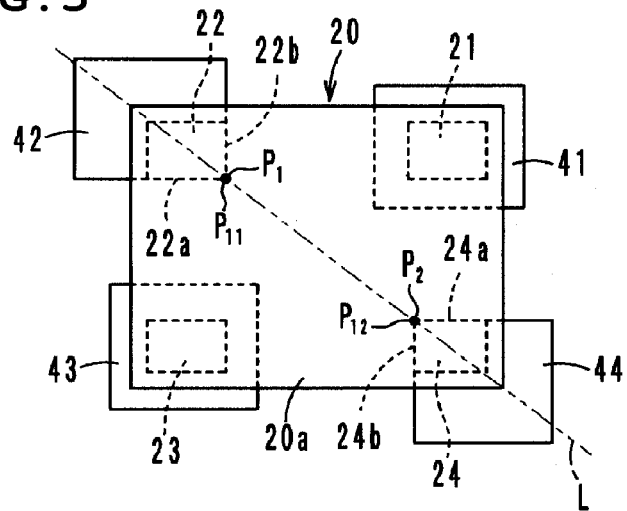
FIG. 3 is a view showing a mounting structure according to a second preferred embodiment of the present invention.

A mounting structure for an electronic component according to a second preferred embodiment is shown in FIG. 3. The second preferred embodiment is similar to the mounting structure according to the first preferred embodiment shown in FIG. 2, but is different in that the size of lands 42 and 44 is the same as the size of lands 41 and 43.

In the second preferred embodiment, areas of the lands 42 and 44 protruding from the electronic component 20 are larger than areas of the lands 41 and 43 protruding from the electronic component 20, to increase the formation areas of the solder fillets. Accordingly, the second preferred embodiment not only provides the advantage provided by the mounting structure of the first preferred embodiment, but also provides an advantage of increasing a mounting strength of the electronic component.

That is, in the mounting structure according to the second preferred embodiment, the sides 22a, 22b, 24a, and 24b, defining the contour of the outer electrodes 22 and 24, are aligned with outer edges of the lands 42 and 44. Therefore, only one positional relationship is permitted between the electronic component 20 and the mounting surface, the positional relationship causing a total area of the outer electrodes 21 to 24 facing the lands 41 to 44 to be maximized.

Third Preferred Embodiment

Figure 4:
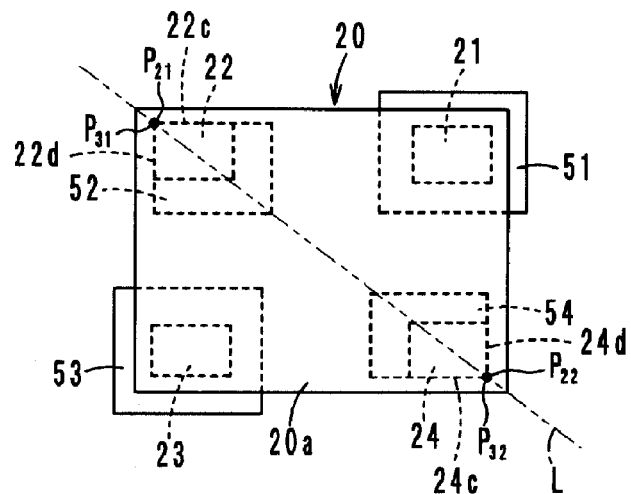
FIG. 4 is a view showing a mounting structure according to a third preferred embodiment of the present invention.

A mounting structure for an electronic component according to a third preferred embodiment is shown in FIG. 4. The third preferred embodiment is similar to the first preferred embodiment shown in FIG. 2, but is different in that the size of two lands 52 and 54 of lands 51 to 54 provided on the circuit board is smaller than the size of the residual lands 51 and 53; and the lands 52 and 54 are configured such that outer vertexes $P_{31}$ and $P_{32}$ defined at opposite ends of a maximum distance between the two lands 52 and 54 are aligned with outer vertexes $P_{21}$ and $P_{22}$ defined at opposite ends of a maximum distance between the two outer electrodes 22 and 24. The two outer electrodes 22 and 24 located along the diagonal L of the principal surface of the electronic component 20 provided with the outer electrodes 21 to 24 are soldered on the lands 52 and 54.

In the third preferred embodiment, the lands 52 and 54 do not protrude from the electronic component 20, thereby decreasing the distance between electronic components 20 mounted on the circuit board. Accordingly, the third preferred embodiment not only provides the advantage provided by the mounting structure of the first preferred embodiment, but also provides an advantage of increasing a packaging density of electronic components.

That is, in the mounting structure according to the third preferred embodiment, sides 22c, 22d, 24c, and 24d, defining the contour of the outer electrodes 22 and 24, are aligned with outer edges of the lands 52 and 54. Therefore, only one positional relationship is permitted between the electronic component 20 and the mounting surface, the positional relationship causing a total area of the outer electrodes 21 to 24 facing the lands 51 to 54 to be maximized.

Fourth Preferred Embodiment

Figure 5:
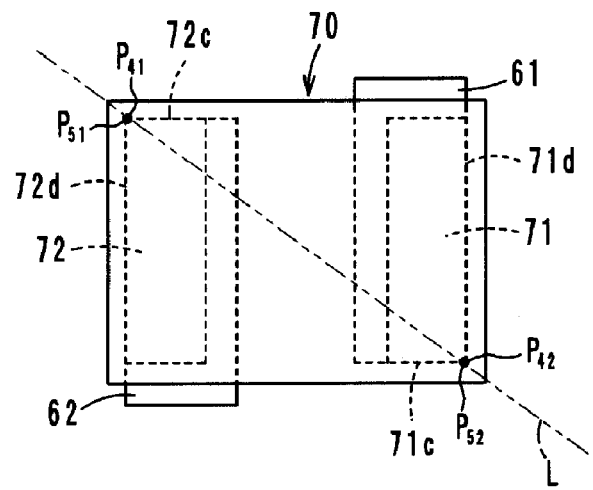
FIG. 5 is a view showing a mounting structure according to a fourth preferred embodiment of the present invention.

As shown in FIG. 5, a forth preferred embodiment provides a mounting structure for an electronic component 70 having two outer electrodes 71 and 72. Two lands 61 and 62 are provided such that outer vertexes $P_{51}$ and $P_{52}$ defined at opposite ends of a maximum distance between the two lands 61 and 62 are aligned with outer vertexes $P_{41}$ and $P_{42}$ defined at opposite ends of a maximum distance between the two outer electrodes 71 and 72 of the electronic component 70. This configuration provides the same advantage as that of the third preferred embodiment.

That is, in the mounting structure according to the fourth preferred embodiment, sides 71c, 71d, 72c, and 72d, defining the contour of the outer electrodes 71 and 72, are aligned with outer edges of the lands 61 and 62. Therefore, only one positional relationship is permitted between the electronic component 70 and the mounting surface, the positional relationship causing a total area of the outer electrodes 71 and 72 facing the lands 61 and 62 to be maximized.

Fifth Preferred Embodiment

Figure 6:
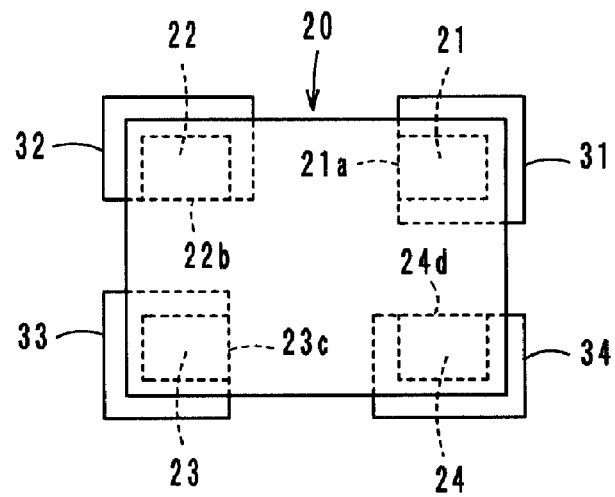
FIG. 6 is a view showing a mounting structure according to a fifth preferred embodiment of the present invention.

As shown in FIG. 6, in a fifth preferred embodiment, a first side 21a of the outer electrode 21 is aligned with an outer edge of the land 31, a second side 22b of the outer electrode 22 is aligned with an outer edge of the land 32, a third side 23c of the outer electrode 23 is aligned with an outer edge of the land 33, and a fourth side 24d of the outer electrode 24 is aligned with an outer edge of the land 34. In the fifth preferred embodiment, only one positional relationship is permitted between the electronic component 20 and the mounting surface, the positional relationship causing a total area of the outer electrodes 21 to 24 facing the lands 31 to 34 to be maximized. Due to the action of the self-alignment, the electronic component 20 can be mounted on the circuit board with high positional accuracy.

Sixth Preferred Embodiment

Figure 7:
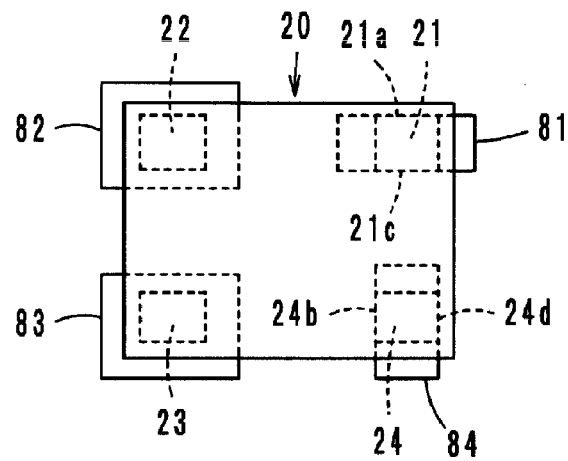
FIG. 7 is a view showing a mounting structure according to a sixth preferred embodiment of the present invention.

As shown in FIG. 7, in a sixth preferred embodiment, lands 81 and 84 are rectangular, and sides 21a, 21c, 24b, and 24d, defining the contour of the outer electrodes 21 and 24, are aligned with outer edges of the lands 81 and 84. So, only one positional relationship is permitted between the electronic component 20 and the mounting surface, the positional relationship causing a total area of the outer electrodes 21 to 24 facing the lands 81 to 84 to be maximized. Due to the action of the self-alignment, the electronic component 20 can be mounted on the circuit board with high positional accuracy.

Seventh Preferred Embodiment

Figure 8:
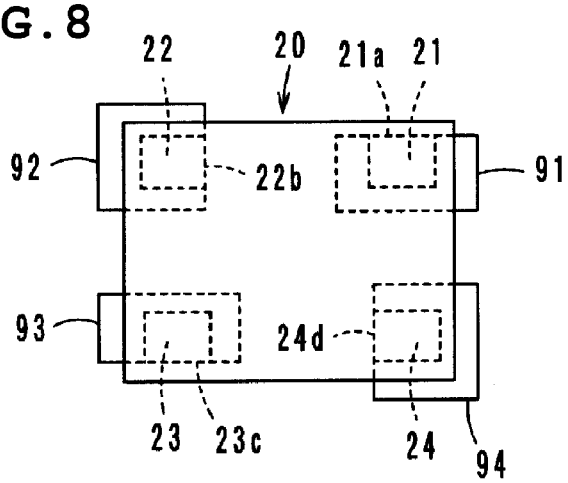
FIG. 8 is a view showing a mounting structure according to a seventh preferred embodiment of the present invention.

As shown in FIG. 8, in a seventh preferred embodiment, a first side 21a of the outer electrode 21 is aligned with an outer edge of a land 91, a second side 22b of the outer electrode 22 is aligned with an outer edge of a land 92, the third side 23c of the outer electrode 23 is aligned with an outer edge of a land 93, and a fourth side 24d of the outer electrode 24 is aligned with an outer edge of a land 94. In the seventh preferred embodiment, only one positional relationship is permitted between the electronic component 20 and the mounting surface, the positional relationship causing a total area of the outer electrodes 21 to 24 facing the lands 91 to 94 to be maximized. Due to the action of the self-alignment, the electronic component 20 can be mounted on the circuit board with high positional accuracy.

Eighth Preferred Embodiment

Figure 9:
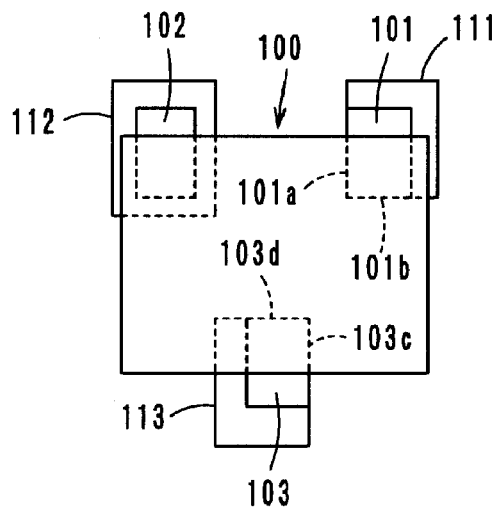
FIG. 9 is a view showing a mounting structure according to an eighth preferred embodiment of the present invention.

As shown in FIG. 9, in an eighth preferred embodiment, an electronic component 100 has a three-terminal structure including outer electrodes 101 to 103 made of metal plate. Lands 111 to 113 each have an area greater than an area of each of the outer electrodes 101 to 103. Sides 101a, 101b, 103c, and 103d, defining the contour of the outer electrodes 101 and 103, are aligned with outer edges of the lands 111 and 113. Thus, only one positional relationship is permitted between the electronic component 100 and the mounting surface, the positional relationship causing a total area of the outer electrodes 101 to 103 facing the lands 111 to 113 to be maximized. Due to the action of the self-alignment, the electronic component 100 can be mounted on the circuit board with high positional accuracy.

Ninth Preferred Embodiment

Figure 10:
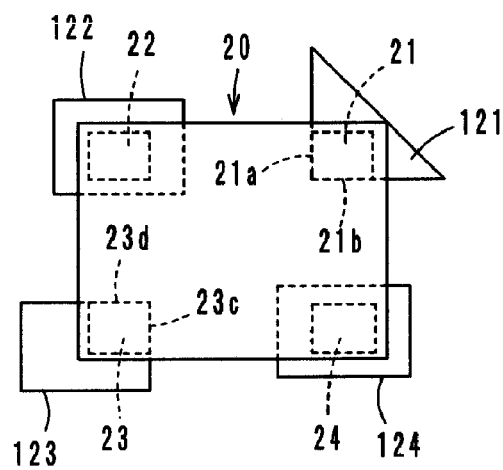
FIG. 10 is a view showing a mounting structure according to a ninth preferred embodiment of the present invention.

As shown in FIG. 10, in a ninth preferred embodiment, a land 121 of lands 121 to 124 is triangular, and sides 21a, 21b, 23c, and 23d, defining the contour of the outer electrodes 21 and 23, are aligned with outer edges of the lands 121 and 123. Thus, only one positional relationship is permitted between the electronic component 20 and the mounting surface, the positional relationship causing a total area of the outer electrodes 21 to 24 facing the lands 121 to 124 to be maximized. Due to the action of the self-alignment, the electronic component 20 can be mounted on the circuit board with high positional accuracy.

Tenth Preferred Embodiment

Figure 11:
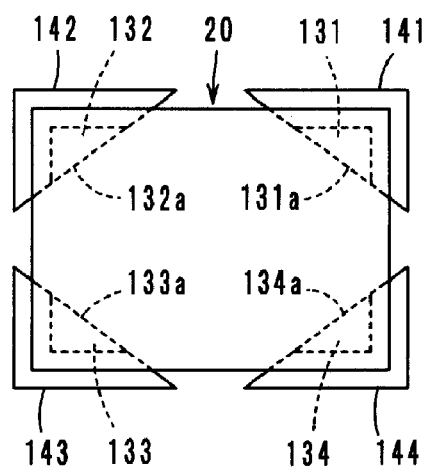
FIG. 11 is a view showing a mounting structure according to a tenth preferred embodiment of the present invention.

As shown in FIG. 11, in a tenth preferred embodiment, outer electrodes 131 to 134 and lands 141 to 144 are triangular. Each of the lands 141 to 144 has an area greater than an area of each of the outer electrodes 131 to 134. In addition, sides 131a, 132a, 133a, and 134a (bases of triangles), defining the contour of the outer electrodes 131 to 134, are aligned with outer edges (bases of triangles) of the lands 141 to 144. Thus, only one positional relationship is permitted between the electronic component 20 and the mounting surface, the positional relationship causing a total area of the outer electrodes 131 to 134 facing the lands 141 to 144 to be maximized. Due to the action of the self-alignment, the electronic component 20 can be mounted on the circuit board with high positional accuracy.

The mounting structure for the electronic component according to the present invention is not limited to those described in the above-described preferred embodiments, and may include modifications within the scope of the present invention.

As described above, the present invention is useful for the mounting structure for mounting the electronic component on the circuit board. In particular, the present invention is excellent in that the electronic component is mounted with high positional accuracy, and the high mounting strength, thereby obtaining the high mounting reliability.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A mounting structure for an electronic component comprising:
    a plurality of outer electrodes provided on a principal surface of the electronic component; and
    a plurality of lands provided on a mounting surface of a circuit board and electrically connected to corresponding ones of the plurality of outer electrodes by solder; wherein
    each of the plurality of lands has an area greater than an area of each of the plurality of outer electrodes;
    one side defining a contour of one of the plurality of outer electrodes is aligned with an outer edge of a corresponding one of the plurality of lands;
    each of the plurality of lands entirely overlaps a respective one of the plurality of outer electrodes such that the plurality of lands overlap all portions of the plurality of outer electrodes in plan view of the principal surface of the electronic component; and
    only one positional relationship is permitted between the electronic component and the mounting surface, the positional relationship causing a total area of the outer electrodes facing the lands to be maximized.

2. A mounting structure for an electronic component comprising:
    a plurality of outer electrodes provided on a principal surface of the electronic component; and
    a plurality of lands provided on a mounting surface of a circuit board and electrically connected to corresponding ones of the plurality of outer electrodes by solder; wherein
    each of the plurality of lands has an area greater than an area of each of the plurality of outer electrodes which are quadrangular;
    each of the plurality of outer electrodes has first to fourth sides at upper, lower, left and right portions thereof in plan view of the principal surface of the electronic component;
    each of the plurality of lands entirely overlaps a respective one of the plurality of outer electrodes such that the plurality of lands overlap all portions of the plurality of outer electrodes in plan view of the principal surface of the electronic component; and
    the plurality of outer electrodes includes at least one outer electrode of which the first side is aligned with an outer edge of a corresponding one of the plurality of lands, at least one outer electrode of which the second side is aligned with an outer edge of a corresponding one of the plurality of lands, at least one outer electrode of which the third side is aligned with an outer edge of a corresponding one of the plurality of lands, and at least one outer electrode of which the fourth side is aligned with an outer edge of a corresponding one of the plurality of lands.

3. A mounting structure for an electronic component comprising:
    a plurality of outer electrodes provided on a principal surface of the electronic component; and
    a plurality of lands provided on a mounting surface of a circuit board and electrically connected to corresponding ones of the plurality of outer electrodes by solder; wherein
    inner vertexes defined at opposite ends of a minimum distance between the outer electrodes located along a diagonal are aligned with inner vertexes defined at opposite ends of a minimum distance between corresponding lands on which the outer electrodes are soldered; and
    each of the plurality of lands entirely overlaps a respective one of the plurality of outer electrodes such that the plurality of lands overlap all portions of the plurality of outer electrodes in plan view of the principal surface of the electronic component.

4. The mounting structure for the electronic component according to claim 3, wherein the inner vertexes of the outer electrodes located along one of two diagonals are aligned with the inner or outer vertexes of the corresponding lands.

5. A mounting structure for an electronic component comprising:
    a plurality of outer electrodes provided on a principal surface of the electronic component; and
    a plurality of lands provided on a mounting surface of a circuit board and electrically connected to corresponding ones of the plurality of outer electrodes by solder; wherein
    outer vertexes defined at opposite ends of a maximum distance between the outer electrodes located along a diagonal are aligned with outer vertexes defined at opposite ends of a maximum distance between the corresponding lands on which the outer electrodes are soldered; and
    each of the plurality of lands entirely overlaps a respective one of the plurality of outer electrodes such that the plurality of lands overlap all portions of the plurality of outer electrodes in plan view of the principal surface of the electronic component.

6. The mounting structure for the electronic component according to claim 5, wherein the outer vertexes of the outer electrodes located along one of two diagonals are aligned with the inner or outer vertexes of the corresponding lands.

* * * * *